United States Patent [19]

Stockel et al.

[11] Patent Number: 4,935,463

[45] Date of Patent: Jun. 19, 1990

[54] SURFACE COMPOSITION FOR A SUBSTRATE AND METHOD OF PREPARATION

[75] Inventors: Elfriede Stockel, Queens Village; Cynthia L. Buchan, Cold Spring Harbor, both of N.Y.

[73] Assignee: Chemco Technologies, Inc., Glen Cove, N.Y.

[21] Appl. No.: 62,713

[22] Filed: Jun. 15, 1987

[51] Int. Cl.$^5$ ............................ C08K 3/36; C08K 3/30; C08K 3/22; C09D 11/04
[52] U.S. Cl. ................................. 524/423; 106/125; 106/126; 106/137; 524/432; 524/447; 524/493; 524/497
[58] Field of Search ............... 524/447, 557, 493, 423, 524/497, 432; 106/125, 126, 137

[56] References Cited

U.S. PATENT DOCUMENTS

| | | | |
|---|---|---|---|
| 3,324,057 | 6/1967 | Suzumura et al. | 524/557 |
| 3,455,241 | 7/1969 | Perkins | 524/493 |
| 4,089,687 | 5/1978 | Harper . | |
| 4,554,307 | 11/1985 | Farrar et al. | 524/497 |
| 4,792,487 | 12/1988 | Schubring et al. | 524/557 |

FOREIGN PATENT DOCUMENTS

| | | |
|---|---|---|
| 61-44697 | 3/1986 | Japan . |
| 61-148097 | 7/1986 | Japan . |
| 1205651 | 9/1970 | United Kingdom . |

*Primary Examiner*—Lewis T. Jacobs
*Attorney, Agent, or Firm*—Morgan & Finnegan

[57] ABSTRACT

The invention is a composition for forming a surface on a suitable substrate comprising
  (a) a water soluble polymer crosslinkable into a water-insoluble form;
  (b) a pigment component;
  (c) silica; and
  (d) a crosslinking agent.

In a preferred embodiment, the polymer is an organic colloid such as polyvinyl alcohol, the pigment component comprises a water dispersible pigment such as titanium dioxide and clay, silica particles have diameters smaller than that of the pigment, and the crosslinking agent comprises a water soluble organic compound containing both an acid and carbonyl group, a water soluble dicarbonyl compound, and a suitable polymerizable resin.

The invention is also a method for generating a surface composition for suitable substrate comprising:
  (a) forming a dispersion comprising
    (i) a water soluble polymer crosslinkable into a water-insoluble form; and
    (ii) a pigment component;
  (b) adding silica to the dispersion to form a dispersion-silica mixture;
  (c) applying the mixture of (b) to a suitable substrate to form a layer;
  (d) drying the layer;
  (e) contacting the dried layer with a crosslinking agent comprising:
    (i) a water soluble organic compound containing both an acid and carbonyl group;
    (ii) a water soluble dicarbonyl compound; and
    (iii) a suitable polymerizable resin,
  (f) drying the product of (e).

21 Claims, No Drawings

SURFACE COMPOSITION FOR A SUBSTRATE AND METHOD OF PREPARATION

BACKGROUND OF THE INVENTION

Common to all lithographic systems is the presence of oil accepting and oil repelling regions. In preparing such systems, a light sensitive element is rendered oil accepting and a substrate material oil repelling.

Conventional lithographic substrates are grained, anodized (or otherwise oxidized) aluminum. Any of a variety of substances, e.g. diazo type compounds, designed to respond to actinic radiation may be applied to form a layer. The desired pattern of radiation is then projected onto the photosensitive layer (such as a layer of polymeric material) to induce a reduction in solubility of the exposed areas of the layer. Such exposed areas become oleophilic. Subsequent removal of the soluble material, i.e. the unexposed areas of the layer, reveals the hydrophilic substrate onto which the layer was originally applied. The hydrophilic substrate is not receptive to oil compatible ink.

Boutle, et al., U.S. Pat. No. 3,620,812 discloses a film material for lithographic plates which comprises a support base of polyester film material, at least one surface of which has been treated with a solution or dispersion in a volatile medium of at least one substance selected from halogen-containing phenolic substances and chlorosubstituted aliphatic acids, at a temperature of at least 30° C., there being adherent to the surface so treated an interlayer such as vinyl chloride-vinyl acetate copolymers, or partially hydrolyzed vinyl chloride-vinyl acetate copolymers, and there being superimposed on said interlayer a hydrophilic layer which comprises a water-swellable organic film-forming material which has been insolubilized and which contains finely divided discreet particles of an inorganic filler or fillers.

Harper, U.S. Pat. No. 4,089,687, discloses a Photographic method for printing a particle pattern which comprises applying to a supporting surface a coating composition comprising a water-soluble polymer crosslinkable into insoluble form by actinic radiation in the presence of hexavalent chromium ions, a soluble dichromate photosensitizer, a water-soluble vanadate and particles of the pattern material, exposing the coating to an actinic radiation until exposed portions of the coating are rendered insoluble, and flushing the coating with an aqueous solvent to remove soluble portions of the coating. Harper differs from the present invention in many ways. For example, the coating composition in Harper requires a water-soluble dichromate photosensitizer and a water soluble vanadate. These ingredients are not needed in the composition of the present invention. Furthermore, the method of the present invention does not require exposure to actinic radition as required by Harper.

Japanese Publications Nos. 61,044,697 (1697) and 61,148,097 ('097) disclose printing plates for producing prints. In 1697, a water-resistant support is coated with a composition comprising inorganic pigment, water soluble binder, water resistant agent and $NH_3Cl$ that has been pH-adjusted, and then dried. The disclosure requires $NH_3Cl$ in the composition and does not disclose crosslinking and drying techniques which are used in the present invention. In 1097, a water-resistent support is coated with a composition comprising inorganic pigments, water-soluble binders and water-resisting agents and then overcoated with a solution obtained by dissolving a metal compound which reacts with hydrophilizing solutions comprising hexacyamo metallic acid salts and/or ammonium phosphates to form hydrophilic, water-insoluble precipitates. The disclosure requires overcoating with a hexacyano metallic acid and/or ammonium phosphate solution, which is not required by the present invention.

It is desirable to have a hydrophilic, abrasion resistant and irregular surface to which a light sensitive element may effectively attach. Surface irregularities, however, must not be so coarse so as to detract from the inherent optical resolution capabilities of either the image source or the photosensitive layer.

Using the polyvinyl alcohol-pigment system of the present invention, a non-white image applied by ink jet or other such electronically controlled device absorbs radiant energy to a greater degree than a white reflective background. Heat generated in the image areas causes thermal dehydration of the PVA, rendering it oil receptive. The PVA-pigment coating system may also be used for conventional diazo-type "wipe-on" coatings. Thus, the surface is versatile in that it can be used in either a direct-to-plate computer generated imaging system or for standard wipe-on methods.

It is an object of the present invention to provide a substrate surface which is uniformly ink repelling and water compatible, wherein ink compatible regions are created by an image forming process. It is also an object of the present invention to provide a surface which is uniformly ink repelling and water compatible, wherein the surface is coated with a substance designed to be insolubilized by radiant energy. It is also an object of the invention to provide a surface which is uniformly ink repelling and water compatible, wherein an ink-jet type imaging system causes chemical modification of the PVA component of the surface rendering it hydrophobic or ink accepting. These and other objects will be described in detail in the present patent application.

SUMMARY OF THE INVENTION

The invention is a composition for forming a surface on a suitable substrate comprising
 (a) a water soluble polymer crosslinkable into a water-in-soluble form;
 (b) a pigment component;
 (c) silica; and
 (d) a crosslinking agent.

In a preferred embodiment, the polymer is an organic colloid such a polyvinyl alcohol, the pigment component comprises a water dispersible pigment such as titanium dioxide and clay, the silica particles have diameters smaller than that of the pigment, and the crosslinking agent comprises a water soluble organic compound containing both an acid and carbonyl group, a water soluble dicarbonyl compound, and a suitable polymerizable resin.

The invention is also a method for generating a surface composition for suitable substrate comprising:
 (a) forming a dispersion comprising
  (i) a water soluble polymer crosslinkable into a water-insoluble form; and
  (ii) a pigment component;
 (b) adding silica to the dispersion to form a dispersion-silica mixture;
 (c) applying the mixture of (b) to a suitable substrate to form a layer;
 (d) drying the layer;

(e) contacting the dried layer with a crosslinking agent comprising:
  (i) a water soluble organic compound containing both an acid and carbonyl group;
  (ii) a water soluble dicarbonyl compound; and
  (iii) a suitable polymerizable resin,
(f) drying the product of (e).

DETAILED DESCRIPTION OF THE INVENTION

The present invention is a composition which when applied to a substrate generates a surface compatible with a number of common imaging systems such as a "wipe-on" diazo system soluble in water and other solvents, said composition comprising a water-soluble crosslinkable polymer, a pigment component, silica and a crosslinking agent.

The invention is also a substrate surface compatible with a number of common imaging systems soluble in water and other solvents, said surface comprising a crosslinked polymer and pigment. Thickness of the substrate surface is preferably about 0.005mm to about 0.10mm.

The surface is a durable, hydrophilic coating having sufficient surface irregularity to provide adequate anchorage for any image forming layer applied thereon. Although many of the qualities exhibited by the surface of the present invention are similar to those of conventional aluminum, the generated surface has distinct characteristics such as greater versatility which represent significant advantages over surfaces presently used in the art. The surfaces exhibit excellent background clean-up and abrasion resistance.

The invention is also a method for preparing the above described surface comprising a means for reducing water solubility of the polymer, wherein said means does not require an external heat source or extensive curing time to promote crosslinking.

The coating described in this invention is a uniform ink repelling/water compatible surface. Ink compatible regions are created by an image forming process. The surface can be coated with a substance which can be insolubilized by radiant energy. Such a coating technique utilizes the crosslinked PVA-pigment coating as a hydrophilic support, just as a conventional aluminum litho plate is used. An alternative method for generating ink compatible regions is to use an ink-jet type imaging system resulting in chemical modification of the PVA component of the surface rendering it hydrophobic or ink accepting.

The composition according to the present invention comprises (1) a water soluble polymer such as an organic colloid crosslinkable into a water-insoluble form, (2) a water-dispersible pigment component, (3) silica and (4) a crosslinking agent.

Preferred polymers useful in the present invention include gelatin and polyvinyl alcohol. While any commonly available grade can be used, a preferred polyvinyl alcohol is one that is fully hydrolyzed and has high viscosity.

The pigment component is preferably a mixture comprising anatase or rutile titanium dioxide and clay in a weight ratio of about 0.5:1 to about 3:1. Titanium dioxide preferably has an average particle size diameter of about 0.1 to about 0.6 microns. Other preferred adjuvants with clay include zinc oxide and barite. The clay is preferably aluminum silicate or kaolinite and has low oil adsorption and particle size less than about 0.8 microns. A pigment component pH of about 8.0–10.0 is preferred in order to form a desirable surface topography. Generally, high pH promotes increased coarseness of a dried layer.

Preferably, the composition comprises silica particles significantly smaller in diameter than $TiO_2$. Furthermore, the silica particle diameters range from about 2 millimicrons to about 60 millimicrons in diameter, and are preferably present in the mixture in a variety of sizes. In a preferred embodiment of the invention, a colloidal suspension such as Nalcoag 1034-A, Nalcoag 1130, or a mixture of these is used as the source of silica. A preferred suspension has a viscosity of about 15 to about 30 centipoise.

The crosslinking agent preferably comprises a water soluble organic compound containing both an acid and carbonyl group, a water soluble dicarbonyl compound, and a suitable polymerizable resin. The water soluble organic compound containing both an acid and carbonyl group is preferably glyoxylic acid, the water soluble dicarbonyl compound is preferably glyoxal, and the polymerizable resin is preferably a cellulosic film resin, melamine formaldehyde, or urea-formaldehdye. The agent is preferably at a pH of about 1.0 to about 6.0, and more preferably 1.0 to about 4.0. Acids suitable for maintaining pH include hydrochloric acid, sulfuric acid, acetic acid and phosphoric acid. These acids should be diluted prior to use in order to accommodate specific coating conditions. Water may be added as needed to dilute the solution at coating time. Preferably, in order to enhance final image surface ink receptivity, the weight-volume ratio for the glyoxylic acid to cellulosic film resin is 0.5–3.0.

The composition of the present invention may further comprise a dispersing agent such as Polywet (Uniroyal Chemical Corp.) and/or a nonionic wetting agent.

The ink-repelling, water-compatible substrate surface comprises:
  (a) a crosslinked polymer;
  (b) a pigment component comprising a water-dispersible pigment and clay;
  (c) silica; and
  (d) components of a crosslinking agent which become bound to the polymer during formation of the crosslinked polymer.

Components of the crosslinking agent comprise one or more of the group consisting of a water soluble organic compound containing both an acid and carbonyl group, a water soluble dicarbonyl compound, and a suitable polymerizable resin.

The method of generating a surface of the present invention comprises:
  (a) forming a dispersion comprising
    (i) a water soluble polymer crosslinkable into a water-insoluble form; and
    (ii) a pigment component;
  (b) adding silica to the dispersion to form a dispersion-silica mixture;
  (c) applying the mixture of (b) to a suitable substrate to form a layer;
  (d) drying the layer;
  (e) contacting the dried layer with a crosslinking agent preferably comprising:
    (i) a water soluble organic compound containing both an acid and a carbonyl group;
    (ii) a water soluble dicarbonyl compound; and
    (iii) a suitable polymerizable resin,
  (f) drying the product of (e).

Preferred materials of the method of the invention have been described above in the description of the composition.

Preferably, the polymer and pigment component are dispersed using a conventional pebble mill so that the milled dispersion has a grind fineness gauge of about 6 microns or less. Silica is preferably added using a colloidal silica suspension, and water is added if necessary to adjust viscosity to the range of about 15–20 centipoise; pH is adjusted to about 8.0–10.0. The dispersion-silica mixture is then applied to a substrate such as a polyester sheet so that the thickness of the dried layer is between about 0.001 and about 0.1 mm. Said layer is dried and then contacted with the crosslinking agent. Silica is added to the dispersion as a means of creating the desired surface topography in the finished coating. After contacting with the agent, the layer-agent composition is dried at or above room temperature to achieve insolubilization of the final coating.

Mixing of the pigment layer with the crosslinking agent prior to coating should be avoided. Such pre-mixing increases viscosity and causes gelling of the pigment mixture crosslinking agent dispersion.

EXAMPLES

Example 1

A coating composition of the invention was prepared as follows.

A dispersion of the following ingredients was made:
80 mls of a 5 weight-percent solution of high viscosity polyvinyl alcohol (Elvanol HV, (DuPont Corp.));
15 grams of rutile $TiO_2$, pigment;
10 grams of kaolinite (George Kaolin Co., Inc) extender pigment; and
20 mls of a 1 weight-percent aqueous solution of dispersing agent (Polywet (Uniroyal Chemical Corp.)).

The ingredients were dispersed using a conventional pebble mill. Milling was continued for six days. Mill charge was adjusted so that the finished dispersion had a reading of 3 u or less on a grind fineness gauge.

A colloidal silica suspension of 50 mls Nalcoag 1034-A and 40 mls Nalcoag 1130 (both available from Nalco Chemical Corp.) was added to the finished dispersion. Viscosity was reduced to a range of 15–20 centipoise by addition of water. pH of the finished composition was less than 9.5.

The finished composition was applied to a polyester sheet substrate so that the thickness of the dried layer was about 0.01 mm.

The pigment containing layer was dried and then brought in contact and wetted with a crosslinking agent of the following composition:
210 mls of a 50 weight-percent solution of glyoxylic acid;
500 mls of a 40 weight-percent solution of glyoxal;
400 mls of a 20 volume-percent solution of the cellulosic film resin Accobond 3524 (available from American Cyanamid Corp.);
210 mls of a 5% HCl solution; and
4000 mls of de-ionized water.

After the pigment containing layer was wetted with the crosslinking agent, drying commenced. Drying temperature was maintained at a range of 100°–135° F.

As illustrated in this Example, a stable surface compatible with the requirements of the lithographic process can be easily prepared by this method. Once crosslinked, the pigment containing layer sustained prolonged soaking in 180° F. water without any apparent deterioration.

Examples 2, 3 and 4

Surfaces were prepared by altering the relative amounts of silica particles added to the pigment dispersion and adjusting the pH of the finished mixture. A pre-subbed polyester sheet was used as the base material and the dried coatings were compared using gloss measurements taken on a Mallinckrodt Multiglass Reflectometer at an 85° geometry. Finished surfaces were coated with a water soluble wipe-on grade diazo compound (Powerplate AN Sensitizer Powder #520).

Exposures were made on a NuArc equipped with a pulsed xenon lamp. The photosensitive material remaining in the non-image area was removed using a suitable developer. The plates thus generated were subsequently tested with an oil base lithographic ink. Results are listed in Table 1.

TABLE 1

| Surface | v/v ratio of colloidal silica added/15 g $TiO_2$ | Gloss Rating | Ink Acceptance |
|---|---|---|---|
| Example 2 | Nalcoag 1060/1130:40 ml/40 ml | 8 | Fair |
| Example 3 | Nalcoag 1034-A/1130:60 ml/30 ml | 67 | Poor |
| Example 4 | Nalcoag 1034-A/1130:50 ml/40 ml | 50 | Excellent |

What is claimed is:

1. An ink repelling, water-compatible composition which cures at room temperature for forming a hydrophilic, abrasion resistant surface on a lithographic plate substrate comprising:
   (a) a water soluble, organic colloid polymer, selected from the group consisting of gelatin and polyvinyl alcohol crosslinkable into water insoluble form;
   (b) a pigment component comprising clay and a pigment selected from the group consisting of anatase titanium dioxide, rutile titanium dioxide, zinc oxide and barite;
   (c) silica; and
   (d) a crosslinking agent having a pH of between 1.0 and 6.0 comprising:
      (i) a water soluble organic compound glyoxylic acid;
      (ii) a water soluble dicarbonyl compound selected from the group consisting of glyoxal and glutaraldehyde; and
      (iii) a polymerizable resin selected from the group consisting of cellulosic film resin, melamine formaldehyde and urea-formaldehyde.

2. A substrate coating composition of claim 1 wherein the organic colloid is gelatin.

3. A substrate coating composition of claim 1 wherein the organic colloid is polyvinyl alcohol.

4. A substrate coating composition of claim 1 wherein the pigment is anatase titanium dioxide or rutile titanium dioxide.

5. A substrate coating composition of claim 1 wherein the pigment is zinc oxide.

6. A substrate coating composition of claim 1 wherein the pigment is barite.

7. A substrate coating composition of claim 1 wherein the clay is aluminum silicate.

8. A substrate coating composition of claim 1 wherein the clay is kaolinite.

9. A substrate coating composition of claim 1 wherein the weight ratio of pigment to clay is about 0.5:1 to about 3:1.

10. A substrate coating composition of claim 1 wherein the clay has low oil adsorption and particle size less than about 0.8 microns.

11. A substrate coating composition of claim 1 wherein the silica has particle size diameters smaller than that of the pigment.

12. A substrate coating composition of claim 11 wherein the diameters range in size from about 2 millimicrons to about 60 millimicrons.

13. A substrate coating composition of claim 11 wherein the source of silica is a colloidal suspension.

14. A substrate coating composition of claim 1 wherein the pigment component pH is between about 8.0 and 10.0

15. A substrate coating composition of claim 1 wherein the dicarbonyl compound is glyoxal.

16. A substrate coating composition of claim 1 wherein the dicarbonyl compound is glutaraldehyde.

17. A substrate coating composition of claim 1 wherein the polymerizable resin is a cellulosic film resin.

18. A substrate coating composition of claim 1 wherein the polymerizable resin is melamine formaldehyde.

19. A substrate coating composition of claim 1 wherein the polymerizable resin is urea-formaldehyde.

20. A substrate coating composition of claim 1, further comprising a dispersing agent.

21. A substrate coating composition of claim 1, further comprising a nonionic wetting agent.

* * * * *